United States Patent [19]

Yamazaki et al.

[11] Patent Number: 4,510,224

[45] Date of Patent: Apr. 9, 1985

[54] ELECTROPHOTOGRAPHIC PHOTORECEPTORS HAVING AMORPHOUS SILICON PHOTOCONDUCTORS

[75] Inventors: Toshinori Yamazaki; Hiroyuki Nomori, both of Hachioji; Masatoshi Matsuzaki, Fussa; Tetsuo Shima; Isao Myokan, both of Hachioji, all of Japan

[73] Assignee: Konishiroku Photo Industry Co., Ltd., Tokyo, Japan

[21] Appl. No.: 491,058

[22] Filed: May 3, 1983

[30] Foreign Application Priority Data

May 6, 1982 [JP] Japan .................................. 57-75658
Jun. 15, 1982 [JP] Japan ................................ 57-102418

[51] Int. Cl.³ ............................................ G03G 5/082
[52] U.S. Cl. ........................................ 430/57; 430/58; 430/64; 430/65; 430/84
[58] Field of Search ................... 430/65, 64, 62, 84, 430/66, 60, 57; 427/39, 74

[56] References Cited

U.S. PATENT DOCUMENTS 4,396,793  8/1983  Madan .................................... 427/74
4,403,026  9/1983  Shimizu et al. ........................ 430/84

Primary Examiner—John E. Kittle
Assistant Examiner—John L. Goodrow
Attorney, Agent, or Firm—Frishauf, Holtz, Goodman & Woodward

[57] ABSTRACT

A photoreceptor comprising a photoconductive layer composed of hydrogenated and/or fluorinated amorphous silicon, a surface modifying layer formed on the above photoconductive layer and composed of hydrogenated and/or fluorinated amorphous silicon carbide and a charge transport layer formed below the above photoconductive layer and composed of hydrogenated and/or fluorinated amorphous silicon carbide wherein the thickness "t" of the above surface modifying layer is selected in a range 400 Å $\leq$ t < 2,000 Å.

22 Claims, 9 Drawing Figures

ELECTROPHOTOGRAPHIC PHOTORECEPTORS HAVING AMORPHOUS SILICON PHOTOCONDUCTORS

BACKGROUND OF THE INVENTION

1. Field of the Invention

The present invention relates to a photoreceptor, for example, an electrophotographic photoreceptor.

2. Description of the Prior Art

Electrophotographic photoreceptor, for example a selenium photoreceptor or a selenium photoreceptor doped with arsenic, tellurium, antimony, etc., or a photoreceptor with zinc oxide or cadmium sulfide dispersed in binder resin have so far been known. However, these photoreceptors pose problems of environmental pollution, thermal instability and insufficient mechanical strength.

Meanwhile, an amorphous silicon (hereinafter abbreviated "a-Si") based electrophotographic photoreceptor has been proposed in recent years. The a-Si has so-called dangling bonds where the Si-Si bond is broken. This type of defect generates many localized energy levels in the energy gap. Therefore, there occurs hopping conduction of thermally excited carriers to lower the dark resistance while trapping of photo excited carriers by the localized energy levels results in poor photoconductivity. It is thus a practice to compensate for these defects by using hydrogen atoms to bond to silicon atoms to fill the dangling bonds.

The above hydrogenated amorphous silicon (hereinafter called "a-Si:H") exhibits a resistivity of $10^8$ to $10^9$ ohm-cm in the dark, which is about ten thousand times lower than amorphous selenium. Therefore, the photoreceptor comprising a single layer of a-Si:H has such a problem that its surface potential decays in the dark at a high rate and its initial charging potential is low. On the other hand, for the sensitive layer of the photoreceptor, this material has a very favorable characteristic that its resistivity greatly decreases when it is exposed to light of the visible or infra-red spectral region.

To endow such a-Si:H with the potential retention, it can be doped with boron to increase its resistivity as high as $10^{12}$ ohm-cm. However, it is not easy to control the boron doping level with satisfactory accuracy. Further, a resistivity as high as $10^{13}$ ohm-cm can be attained by introducing a trace of oxygen with boron. When used for the photoreceptor, however, this kind of material exhibits an inferior photosensitivity causing problems, such as unsharp potential drop at the edge and nonnegligible residual potential after exposure.

In addition, the photoreceptor with a-Si:H exposed in the surface has not yet been fully examined for the chemical stability of its surface, as for example, possible effects of long-term exposure to atmosphere or moisture or those of chemical species as generated under corona discharges. It is known, however, that after having been left to stand for more than a month it is affected so much by moisture that there is a remarkable lowering in the charging potential.

On the other hand, a method of manufacturing hydrogenated amorphous silicon carbide (hereinafter called "a-SiC:H") is described in Phil. Mag., Vol 35 (1978), etc. It is known that this material has characteristics, such as high heat resistance, high surface hardness, higher dark resistivity ($10^{12}$ to $10^{13}$ ohm-cm) than a-Si:H, and optical energy gap changeable between 1.6 and 2.8 eV depending on the carbon content.

An electrophotographic photoreceptor comprising a combination of a-SiC:H and a-Si:H was proposed, for example, in the Japanese Patent Publication Open to Public Inspection (hereinafter called "Japanese Patent 0.P.I. Publication) No. 17952/1982. According to this invention, a triple layered photoreceptor is formed wherein an a-Si:H layer provides a sensitive (photoconductive) layer with a first a-SiC:H layer formed on its light receiving surface and second a-SiC:H layer on its back surface (on substrate electrode side).

It is noted however that this known photoreceptor has not yet been examined so extensively on how its characteristics may be affected by the thickness of individual layers. There was noted that the preferred thickness of the above first a-SiC:H layer was between 2,000 Å and 5,000 Å. However, a study made by the present author revealed that the above range of thickness provides a product that exhibits very poor performances in the sensitivity characteristics as the photoreceptor.

For the above known photoreceptor, there has been made almost no detailed examination on how the thickness of the first a-SiC:H layer may affect the characteristics of the photoreceptor. After full examination, the present author found a range of thickness that could never be expected from the prior art, which led to discovery of a type of photoreceptor of very excellent characteristics. In addition, examination was made on the thickness of the second a-SiC:H layer and also a-Si:H layer to find a range of thickness for individual layers that could improve performance.

SUMMARY OF THE INVENTION

Accordingly, it is an object of the present invention to provide an a-Si photoreceptor, for example, for electrophotographic use that comprises a thin coating capable of retaining a high surface potential, exhibits superior sensitivity to light of the visible and infrared spectral ranges, high heat resistance and printing resistance, and yet stable resistance to environmental conditions.

It is another object of the invention to provide a photoreceptor that can not only make the most of the merits of the triple layered structure as mentioned above but effectively prevent injection of carriers from the substrate.

That is, the photoreceptor embodying the present invention comprises a photoconductive layer made of hydrogenated and/or fluorinated amorphous silicon, for example, a-Si:H, a surface modifying layer formed on such photoconductive layer and made of hydrogenated and/or fluorinated amorphous silicon carbide, for example, a-SiC:H, and a charge transport layer formed under the above photoconductive layer and made of hydrogenated and/or fluorinated amorphous silicon carbide, for example, a-SiC:H, preferably with insertion of a blocking layer made of hydrogenated and/or fluorinated amorphous silicon carbide, for example, a-SiC:H and doped with a high content of impurities, for example, phosphor or boron, to give a prescribed conduction type between the above charge transport layer and substrate, particularly the substrate electrode, wherein the thickness "t" of the above surface modifying layer is selected in a range $400 \text{ Å} \leq t < 2000 \text{ Å}$.

BRIEF DESCRIPTION OF THE DRAWINGS

Other features and advantages of the invention will be apparent from the following description taken in connection with the accompanying drawings wherein.

DESCRIPTION OF THE PREFERRED EMBODIMENTS

A photoreceptor embodying the present invention will be described below in detail.

Figure 1:
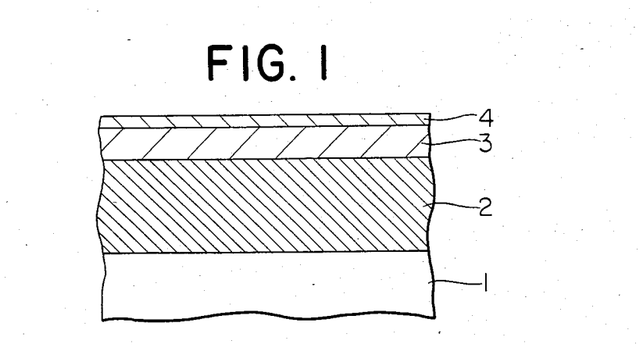
FIG. 1 is a partial sectional view of an electrophotographic photoreceptor.

This embodiment comprises, for example, as illustrated in FIG. 1, an electrically conductive substrate 1, and second a-SiC:H layer 2 (charge transport layer), a-Si:H layer 3 (photoconductive layer), and first a-SiC:H layer 4 (surface modifying layer) successively laminated on such substrate 1. The primary functions of the a-SiC:H layer 2 are to retain the given potential, transport charges and improve adherence of the coating to the substrate 1. It is preferably 5,000 Å to 80 μm thick and more preferably 10 μm to 30 μm. The photoconductive layer 3 generates charge carriers in response to impinging light, which is preferably 2,500 Å to 5 μm and more preferably 1 μm to 2 μm thick. Further, the first a-SiC:H layer 4 functions to improve the surface potential characteristics of this photoreceptor, maintain its potential characteristics and resistance to environmental conditions (for avoidance of possible effects of moisture, atmosphere and chemical species produced by corona discharges) for a long period of time, improve its printing resistance through the high surface hardness, improve its hot transfer performance and particularly pressure intermediate transfer performance, etc. The layer 4 thus works, as the surface modifying layer. It is important to select the thickness "t" of this first a-SiC:H layer much smaller than the range of prior art, namely, in a range of 400 Å = t < 2,000 Å as mentioned above. This point constitutes one of the indispensable requisites of the present invention.

Layers of the photoreceptor of the invention will be individually described below more fully.

First a-SiC:H layer

The a-SiC H layer 4 is essential to improve the surface quality of the photoreceptor and thereby provide an a-Si photoreceptor excellent for practical use. Namely, it makes two basic properties charge retention in the surface and the photo decay of surface potential, available to the photoreceptor. The characteristic performances of the photoreceptor are thereby stabilized very much in repeated charging and photo decay, so even after the photoreceptor is left to stand for a long period, for example, longer than a month, its favorable potential characteristics can still be reproduced. By contrast, the photoreceptor with a-Si:H exposed in the surface is susceptible to moisture, atmosphere, and air containing ozone, so its potential characteristics change much with time. Further, because of its high surface hardness, a-SiC:H shows wearproof performances in copy process steps of development, image transfer, cleaning, etc. In addition, exhibiting favorable heat resistance, it can be applied to the hot process, for example, of pressure intermediate transfer.

For overall achievement of the superior effects as mentioned above, it is very important to select the thickness of the a-SiC:H layer 4 in the aforementioned range of 400 Å $\leq$ t < 2,000 Å. Namely, in case of thickness of 2,000 Å or over, the residual potential level rises too high and further there is a decline in the sensitivity, resulting in the loss of favorable characteristics of the a-Si photoreceptor. On the other hand, in case of thickness below 400 Å, charges, as they deposit in the surface by charging, are lost by the tunnel effect, resulting in increased dark decay or remarkable decline in the photosensitivity. This is why it is essential to have the thickness of the a-SiC:H layer 4 selected in a range from 400 Å to up to but not including 2,000 Å. Such thickness range can never be conceived of from the prior art, being discovered by the present author for the first time.

Figure 2:
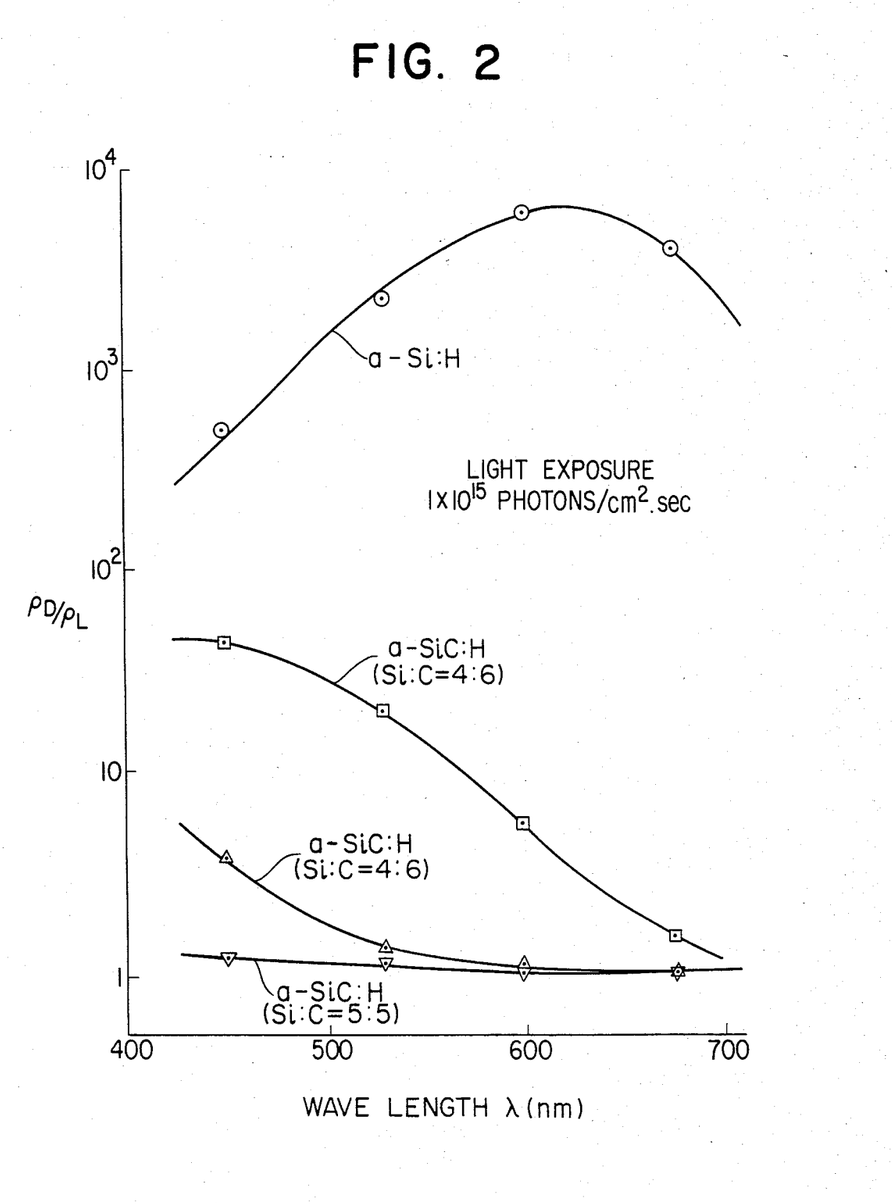
FIG. 2 is a graph representing the spectral dependency of the photoconductivity of a-Si:H and two compositions of a-SiC:H, respectively.

Further, it was found that to have this a-SiC:H layer 4 exert the above favorable effects, it is important to properly select the carbon content of such layer. If we express the chemical composition of this layer by a-$Si_{1-x}C_x$:H, the preferred range of x is from 0.1 to 0.9 (carbon content from 10 to 90 atomic percent), and more preferably, 0.1 to 0.7. Particularly, in case of $x \geq 0.1$, the layer has an optical energy gap equivalent to about 2.0 eV or larger, so it only exhibits reduced photoconductivity to visible and infrared spectral ranges as shown in FIG. 2 ($\rho_D$ and $\rho_L$ are the resistivity in the dark and the one under exposure to light, respectively. It is noted that the smaller the ratio $\rho_D/\rho_L$, the lower the photoconductivity). Because of the optical transparency or so-called "window effect", therefore, the impinging light reaches the a-SiH layer 3 (charge generation layer) almost without loss of intensity. On the other hand, in case the parameter x exceeds 0.9, the layer is almost composed solely of carbon, whereby it does not exhibit the characteristic behavior of semiconductor material, and furthermore, precipitation of the a-SiC:H layer under glow discharges takes more time. This is why $x \leq 0.9$ is preferable.

Second a-SiC:H layer

The second a-SiC:H layer 2 is intended for two functions, charge retention and charge transport. It is characterized by a dark resistivity not smaller than $10^{12}$ ohm-cm and a high withstand voltage and capable of retaining a high potential per unit thickness of layer. Further, electrons or holes injected from the sensitive layer 3 have high mobility and life, so charge carriers are efficiently transported to the substrate 1. In addition, since the energy gap can be adjusted properly by choosing the carbon content, it becomes possible to efficiently inject charge carriers from the sensitive layer 3 to the layer 2, as they are generated under exposure to light in the former layer, without presenting any barrier thereto. Furthermore, this second a-SiC:H layer 2 exhibits a favorable performance in bonding or film adherence to the substrate 1, which is, for example, an aluminium electrode. The a-SiC:H layer 2 thus retains a high surface potential of practically usable level, transports charge carriers efficiently and fast as they are generated in the a-Si:H layer 3, and thereby provides a photoreceptor of high sensitivity practically free of residual potential.

To perform the above functions, for example, in the dry process of Carlson's system, the a-SiC:H layer 2 preferably has a thickness between 5,000 Å and 80 μm and more preferably between 10 and 30 μm. A thickness below 5,000 Å is too thin to achieve the surface potential level necessary for effective development, while at a thickness above 80 μm the surface potential increases excessively resulting not only in poor exfoliation of sticking toner but in adherence of carrier grains that comprise the double component developer. It is noted however that even if this a-SiC:H layer is made thin as compared to the selenium photoreceptor, for example, a little over 10 μm in thickness, a surface potential of practically usable level will still be attained.

If the chemical composition of this a-SiC:H layer 2 is expressed by $a-Si_{1-x}C_x:H$, the preferred range of the parameter x is $0.1 \leq x \leq 0.9$ (carbon content from 10 to 90 atomic percent). In case of $0.1 \leq x$, the layer 2 can be made completely different from the a-Si:H layer 3, while in case of $x > 0.9$, the layer 2 is almost fully composed of carbon losing the characteristic properties of semiconductor material and in addition the precipitation for coating takes more time. To avoid these difficulties, the preferred range is $x \leq 0.9$.

a-Si:H layer (photoconductive or sensitive layer)

The a-Si:H layer 3 exhibits a high photoconductivity to light of visible and infrared spectral regions. As illustrated in FIG. 2, red light of a wave length around 650 nm increases the ratio $\rho_D/\rho_L$ to its maximum level of $10^4$. If this a-Si:H is used for the sensitive layer, a photoreceptor that is highly sensitive to the whole visible and infrared spectral regions can be provided.

To absorb visible and infrared spectra efficiently for generation of charge carriers, the a-Si:H layer 3 is preferably 2,500 Å to 5 μm thick.

In case of a thickness below 2,500 Å, the impinging light is not fully absorbed by such layer, partially reaching the underlying a-SiC:H layer 2, which means a substantial decline in photosensitivity. Further, though the a-Si:H layer 3 is endowed with a high charge transport capacity, it has a resistivity in the order of $10^9$ ohm-cm exhibiting no charge retention in itself, so when it is used for the sensitive layer, it need not be thicker than the thickness necessary for the absorption of light. Thus, a maximum thickness of 5 μm is sufficient.

An apparatus or glow discharger that can be used for the fabrication of the photoreceptor embodying the present invention will be described below with reference to FIG. 3.

This apparatus 11 has a vacuum chamber 12, in which the substrate 1 as mentioned above is held on the substrate holder 14 with a heater 15 built in to heat the substrate 1 to a prescribed temperature. Facing the substrate 1, there is disposed a high frequency electrode 17 to generate glow discharges between itself and substrate 1. In the figure, reference numerals 20 through 24, 27 through 30, 35, 36, and 38 are valves, 31 is a source of SiH4 or gaseous silicon compound, 32 is a source of CH4 or gaseous carbon compound, 33 is a source of carrier gas, such as Ar or H2, and 34 is a source of 1% diborane or phosphine gas in argon. In this glow discharger, first, the substrate 1, for example, an aluminium plate is set in the vacuum chamber 12 after cleaning its surface. The valve 36 is then adjusted properly to evacuate the vacuum chamber 12 to a gas pressure of $10^{-6}$ Torr and the substrate 1 is heated and maintained at a prescribed temperature, for example, 200° C. Next, a gaseous mixture of SiH4 or other gaseous silicon compound and CH4 or other gaseous carbon compound diluted in a proper concentration with a carrier gas which is an inert gas of high purity is introduced in the vacuum chamber 12 and a high frequency voltage is applied from the high frequency power supply 16 under a reaction pressure of 0.01 to 10 Torr. The above reactant gases are thereby decomposed under glow discharges to deposit hydrogen containing a-SiC:H on the substrate 1 to form the layer 2 (and also the layer 4) as mentioned above. In the above process, if the ratio of the flow rate of silicon compound to that of carbon compound and the temperature of substrate are adjusted properly, $a-Si_{1-x}C_x:H$ including one whose parameter x is, for example, as large as 0.9 can be deposited in a desirable composition with a desirable width of optical energy gap and at a rate of 1,000 Å/min or more without much change in the electrical characteristics of the deposited a-SiC:H. Further, a-Si:H can be deposited for the above sensitive layer 3 by decomposing the silicon compound under glow discharges with no supply of the carbon compound.

Both of the above first and second a-SiC:H layers must contain hydrogen since without loading of hydrogen, the photoreceptor will fail to exhibit charge retention characteristics satisfactory for practical application. For this reason, the hydrogen content is preferably between 1 and 40 atomic percent and more preferably between 10 and 30 atomic percent.

The hydrogen content of the photoconductive layer 3 is indispensable to compensate for the dangling bonds and thereby improve the photoconductivity and charge retention, which is ordinarily selected in a range from 1 to 40 atomic percent and preferably from 10 to 30 atomic percent. In addition, for higher resistance, sensitization, and adjustment of conductivity of a-Si:H, oxygen, nitrogen, etc. and/or transition metals, such as chromium and manganese, may be introduced therein as necessary.

It is noted that to compensate for the dangling bonds, a-Si (and a-SiC) can be loaded with fluorine instead of or in combination with hydrogen to provide a-Si:F or a-Si:H:F (and a-SiC:F or a-SiC:H:F). In this case, the fluorine content is preferably between 0.01 and 20 atomic percent and more preferably between 0.5 and 10 atomic percent.

The above fabrication method uses the decomposition process under glow discharges. Additionally, spattering, ion plating, or vaporization of a-si:H in the presence of hydrogen activated or ionized by an hydrogen discharge tube and particularly by the present author's method as disclosed in Japanese Patent O.P.I. Publication No. 78413/1981 (Japanese Patent Application No. 152455/1979), etc. may be used in the fabrication of the photoreceptor as mentioned above. Besides SiH4 and CH4, any of $Si_2H_6$, $SiHF_3$, $SiF_4$, and their gaseous derivatives and a gaseous lower hydrocarbon, such as $C_2H_6$ or $C_3H_8$ or $CF_4$ may be used for reactant gases.

The present invention as applied to the electrophotographic photoreceptor will be understood more clearly with reference to the following Examples.

EXAMPLE 1

An electrophotographic photoreceptor having the layered structure of FIG. 1 was fabricated on an aluminium substrate by decomposition under glow discharges. To do this, first, a clean aluminium substrate with smooth surfaces was set in position in the vacuum reaction chamber of the glow discharger. After evacuation of the reaction chamber to a vacuum level as high as $10^{-6}$ Torr, the substrate was heated to 200° C. and then argon gas of high purity was introduced. A high frequency voltage of 13.56 MHz was applied under a back pressure of 0.5 Torr for a power density of 0.04 W/cm$^2$ to conduct preliminary discharges. Reactant gases, $SiH_4$ and $CH_4$ were then introduced to decompose a gas mixture of $Ar+SiH_4+CH_4$ as supplied at a flow rate ratio of 2:1:1.5 under glow discharges. An a-SiC:H layer intended to retain the surface potential and transport charges was thus prepared 1.0 μm thick at a deposition rate of 350 Å/min. Optical energy gap of this a-Si:H layer was 2.1 eV. Further, by means of Auger electron spectroscopy the carbon content was found to be 20 atomic percent. After the reaction chamber was again evacuated, $SiH_4$ was decomposed under glow discharges with no supply of $CH_4$ using argon for the carrier gas to deposit the photoconductive a-Si:H layer 1.0 μm thick. Thereafter, the supply of $CH_4$ was resumed to decompose a gas mixture of $Ar+SiH_4+CH_4$ as supplied this time at a different flow rate ratio of 2:1:4 to add a surface modifying a-SiC:H layer 0.15 μm thick. An electrophotographic photoreceptor was thus completed. The optical energy gap of this surface modifying a-SiC:H layer was estimated to be 2.5 eV. Further, an analysis showed that its carbon content was 50 atomic percent.

A voltage of 6 kV of negative polarity was applied to the photoreceptor thus fabricated for corona discharges, when a surface potential of $-85$ V was attained. After dark decay of 6 sec, it changed to $-60$ V. Next, exposure to a beam of light of 1 lux resulted in an almost linear decay of the surface potential. At this time, the half-decay exposure was estimated to 0.5 lux·sec and there was detected almost no residual potential. Charging and exposure were repeated a hundred times, which proved very favorable repetition characteristics. On the other hand, though positive charging gave a surface potential and dark decay that were equivalent in degree to those estimated after negative charging, the photo decay resulted in an unsharp edge potential drop and a residual potential of 25 V.

EXAMPLE 2

An electrophotographic photoreceptor of the layered structure that was achieved by the same method as in Example 1 except that the potential retention a-SiC:H layer was fabricated next to the aluminium substrate and made 10 μm thick was fabricated, namely, by successively laminating such potential retention layer, a sensitive a-Si:H layer 1.0 μm thick and a surface modifying a-SiC:H layer 0.15 μm thick and its charging and photo decay characteristics were measured. When a voltage of $-6$ kV was applied for corona discharges, the surface of photoreceptor was charged $-750$ V, which declined to $-550$ V after dark decay of 6 sec. Further, like Example 1, the photo decay characteristics under exposure to light and repetition characteristics were found very satisfactory. Even after being left to stand for more than a month, the photoreceptor reproduced the satisfactory charging and photo decay characteristics. On the other hand, though positive charging resulted in the same degree of charging as negative charging, there was observed almost no decay of the surface potential under exposure to light. These results showed that as compared to the selenium photoreceptor, the 10 μm thick a-SiC:H layer has a high potential retention per unit thickness of layer, retaining a surface potential almost proportional to the thickness of the layer and that this layer efficiently accepts electrons among charge carriers generated in the sensitive a-Si:H layer and effectively transports them.

Next, the Carlson's system was used with this photoreceptor to do negative charging under corona discharges, expose to the original image for formation of an electrostatic latent image, develop a visible image with positively charged toner through the magnetic brushing method and then transfer the visible image to the ordinary paper. There were thus successfully obtained sharp copy images of high density without background.

EXAMPLE 3

The same fabrication method as in Example 1 was used to form a potential retention a-SiC:H layer 10 μm thick on an aluminium substrate and further laminate a sensitive a-Si:H layer and a 0.15 μm thick surface a-SiC:H layer thereon. Photoreceptors whose sensitive a-Si:H layer was 0.1, 0.5 and 1.0 μm, respectively, were thus prepared. They were compared for the charging and photo decay characteristics. After being charged under corona discharges by application of a voltage of $-6$ kV, the surface of the photoreceptor was exposed to a light of 1 lux. The results showed that the initial charging potential and percentage dark decay were almost equivalent in degree to the photoreceptor of Example 2 while the half decay exposure was estimated to 15, 0.6 and 0.5 lux·sec, respectively. Namely, in case the thickness of the sensitive layer was not larger than 0.5 μm, there was a substantial decline in the photosensitivity. Accordingly, it is important that the sensitive a-Si:H layer is made at least 0.5 μm thick so the whole intensity of impinging light may be absorbed in this layer never reaching the underlying potential retention layer.

EXAMPLE 4

Figure 4:
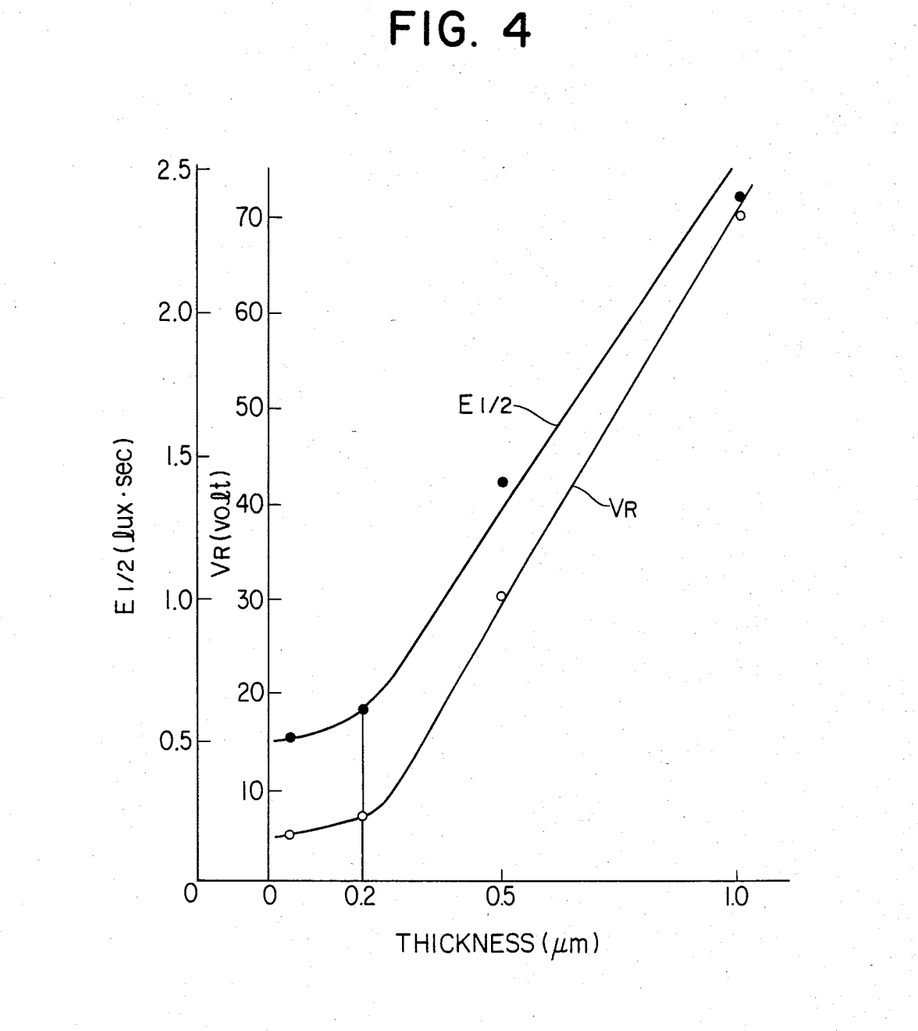
FIG. 4 is a graph, representing the dependency of the half decay exposure and residual potential of a photoreceptor on the thickness of surface a-SiC:H layer.

Photoreceptors having the layered structure as achieved by the same fabrication method as in Example 1, namely, by laminating on an aluminium substrate a potential retention a-SiC:H layer 10 μm thick, a sensitive a-Si:H layer 1.0 μm thick and further a surface modifying a-SiC:H layer were fabricated with the surface a-SiC:H layer 0.05, 0.2, 0.5 and 1.0 μm thick, respectively. They were compared for the charging and photo decay characteristics. After the surface of the photoreceptor was charged under corona discharges with a voltage of $-6$ kV applied thereto, it was exposed to a beam of light of 1 lux to measure its photo decay characteristics. The following table gives the results while FIG. 4 presents curves fitted to the plotted data.

| Thickness of surface modifying a-SiC:H layer (μm) | $E_{\frac{1}{2}}$ | $V_R$ |
|---|---|---|
| 0.05 | 0.5 | 5 |
| 0.2 | 0.6 | 7 |
| 0.5 | 1.4 | 30 |
| 1.0 | 2.4 | 70 |

In the above table, $E_{\frac{1}{2}}$ was the half decay exposure (lux·sec) and $V_R$ was the residual potential (volt). As evident from these results, in case the thickness of the surface a-SiC:H layer was 0.2 μm or over, there were substantial decreases in the photosensitivity and substantial increases in the residual potential. Further, the initial charging potential was −760 V in case the surface layer was 0.2 μm thick. For thicker surface layers, there were increases in the initial charging potential equivalent to differences in the residual potential in the above table. The results as given in the above table and FIG. 4, and the fact as described in Examples 1 and 2 that there was detected no photosensitivity in case of positive charging suggested a likely hypothesis that the above decreases in the photosensitivity and the nonnegligible residual potential occurred since a-Si:H and a-SiC:H deposited by the fabrication method of the present Example had such energy levels that the interface between the a-Si:H layer and a-SiC:H layer allows smooth injection of electrons, generated in the sensitive a-Si:H layer, into the a-SiC:H layer while presenting a barrier to holes making their injection difficult. As mentioned above, to have the surface modifying a-SiC:H layer thinner than 0.2 μm was found important in order that holes might be readily injected for neutralization of negative charges in the surface with electrons having easy access to the substrate so as to attain favorable photo decay characteristics. Further, in case a surface a-SiC:H layer 0.15 μm thick but with a carbon content of 20 atomic percent was used, the half decay exposure was estimated to 1.0 lux·sec. In this case, the optical energy gap for the a-SiC:H layer of such carbon content was 2.1 eV, so the intensity of impinging light was partially absorbed by the surface layer, resulting in a lowering in the photosensitivity. As shown above, it was found preferable that the surface a-SiC:H layer has a carbon content of 40 atomic percent or over as shown in FIG. 2 exhibiting practically no photoconductivity to visible and infrared spectra and therefore being transparent to these spectral ranges.

COMPARATIVE EXAMPLE 1

To prove the favorable effects of the surface modifying a-SiC:H layer in the layered structure of the present invention, namely, stabilization of the potential characteristics and maintenance of the chemical stability of the surface, photoreceptors having no surface a-Si:H layer were fabricated to examine their charging characteristics and resistance to environmental condition. First, a photoreceptor with an a-SiC:H layer next to the substrate being as thin as 0.5 to 1 μm and an a-SiC:H layer fabricated thereon as thick as 4 to 5 μm to form the free surface could be charged to 200 to 300 V in both polarities but there was a large dark decay and further its charging and photo decay characteristics changed much by repetition. In addition, after the photoreceptor was left to stand for a period longer than a month, the charging potential declined substantially due to effects of the moisture, atmosphere, etc. Next, a photoreceptor with an a-SiC:H layer next to the substrate as thick as 10 μm and an a-Si:H layer fabricated thereon as thick as 1.0 μm to form the free surface could be charged to about 700 V in both polarities but it showed almost no photosensitivity. A likely reason was that without retention of charges in the surface of a-Si:H layer these charges may have leaked to reach the interface with the underlying a-SiC:H layer making the normal charging and photo decay of electrophotographic photoreceptor unavailable.

As evident from the above Examples, in the layered structure of the present invention, provision of a surface modifying a-SiC:H layer having a thickness in a particular range is indispensable to have an a-Si photoreceptor of practical, favorable and stable characteristics.

The second embodiment of the present invention will be described below.

Figure 5:
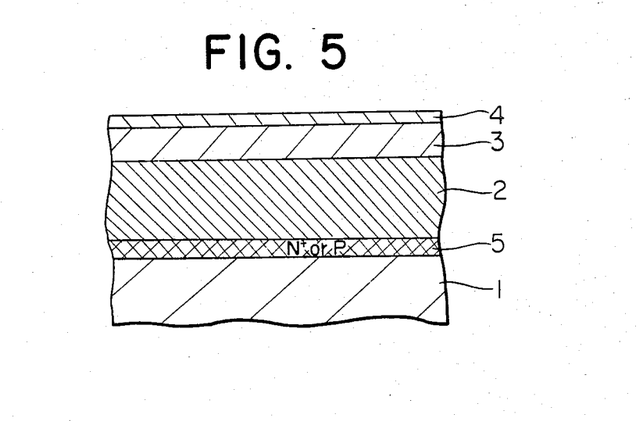
FIG. 5 is a partial sectional view of an electrophotographic photoreceptor.

The photoreceptor that conforms to this embodiment is formed, as illustrated in FIG. 5, on an electrically conductive substrate 1 by successively laminating a blocking layer 5 comprising n type or p type a-SiC:H doped with a high content of an element of the group VA or IIIA of the periodic table, and the already mentioned three layers, namely, the charge retention/transport a-SiC:H layer 2, photoconductive a-Si:H layer 3 and surface modifying a-SiC:H layer 4.

The blocking layer 5 contributes much to prevent injection of carriers from the substrate 1 and thereby maintain the given surface potential satisfactorily. For this purpose, it is important to dope such layer with an element of the group VA or IIIA so the layer may be of n type or further of n+ type in case of negative charging type photoreceptor and of p type or further of p+ type in case of positive charging type photoreceptor. Its thickness is preferably between 50 Å to 1 μm and more preferably between 400 Å 1 μm. The second a-SiC:H layer is primarily intended for charge retention and transport, which is preferably formed 5,000 Å to 80 μm thick and more preferably 10 to 30 μm thick. The photoconductive layer 3 generates charge carriers when exposed to light, which is preferably formed 2,500 Å to 10 μm thick and more preferably 2,500 Å to 5 μm thick. Further, the surface modifying layer 4 is intended to improve the surface potential characteristics of the photoreceptor, maintain such characteristics for a long period of time, maintain the resistance to environmental condition for the prevention of possible effects of moisture, atmosphere and chemical species as generated under corona discharges, improve the printing resistance by making use of a high surface hardness, and further improve the thermal resistance and hot transfer performance of the photoreceptor during its use. The thickness of this surface modifying layer is 400 Å or over but smaller than 2,000 Å.

What is noteworthy with this photoreceptor is that since the laminate structure of a-SiC:H/a-Si:H/a-SiC:H as already mentioned can be formed on the blocking layer, features of such laminate structure are provided while heavily doped with an element of the group VA or IIIA of the periodic table so the blocking layer is converted into n type or p type, so on charging injection of carriers (holes or electrons) from the substrate may be effectively prevented.

In addition, since the photoreceptor of FIG. 5 has the laminate structure as mentioned above, there can be provided an a-Si photoreceptor, for example, for electrophotographic use which, when compared to the conventional selenium photoreceptor, maintains a high potential at a thin coating thickness, exhibits superior sensitivity to light of visible and infrared spectral regions, presents high thermal resistance and printing resistance, and yet shows stable resistance to the environmental condition.

Figure 3:
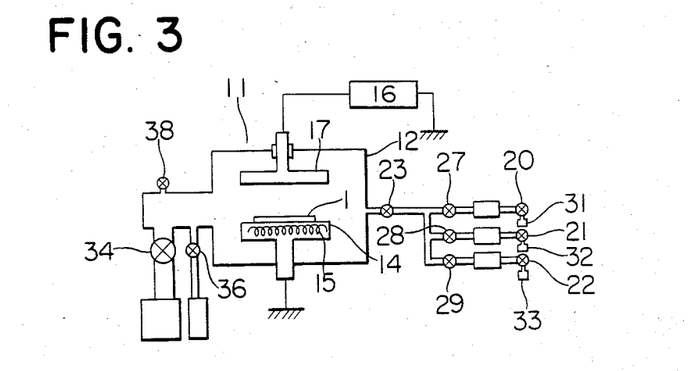
FIG. 3 is a schematic sectional view of an apparatus to fabricate the above photoreceptor.

The photoreceptor of the present embodiment can be fabricated by a glow discharger, apparatus as shown in FIG. 3. Namely, in this apparatus, first, a substrate 1, for example, an aluminium plate is set in position in a vacuum chamber 12 after cleaning its surface. Next, the chamber 12 is evacuated to a gas pressure of $10^{-6}$ Torr by adjusting the valve 36 and the substrate 1 is heated and maintained at a prescribed temperature, for example, 200° C. Using an inert gas of high purity for the carrier gas, a gas mixture of $SiH_4$ or gaseous silicon compound, phosphine or diborane gas, and $CH_4$ or gaseous carbon compound diluted to a proper concentration is introduced into the vacuum chamber 12 and a high frequency voltage is applied from the high frequency power supply 16 under a reaction pressure of 0.01 to 10 Torr. The above reactant gases are thereby decomposed under glow discharges to deposit a-SiC:H containing phosphorus or borone for formation of the above layer 5 on the substrate 1. The a-SiC:H layer 2, a-Si:H layer 3 and a-SiC:H layer 4 are formed in the way as already mentioned.

In fabricating individual layers by decomposition under glow discharges as mentioned above, particularly the a-SiC:H layer 5 requires a proper selection of the flow rate ratio of the phosphine gas or diborane gas and gaseous silicon compound, for example, monosilane.

Figure 6:
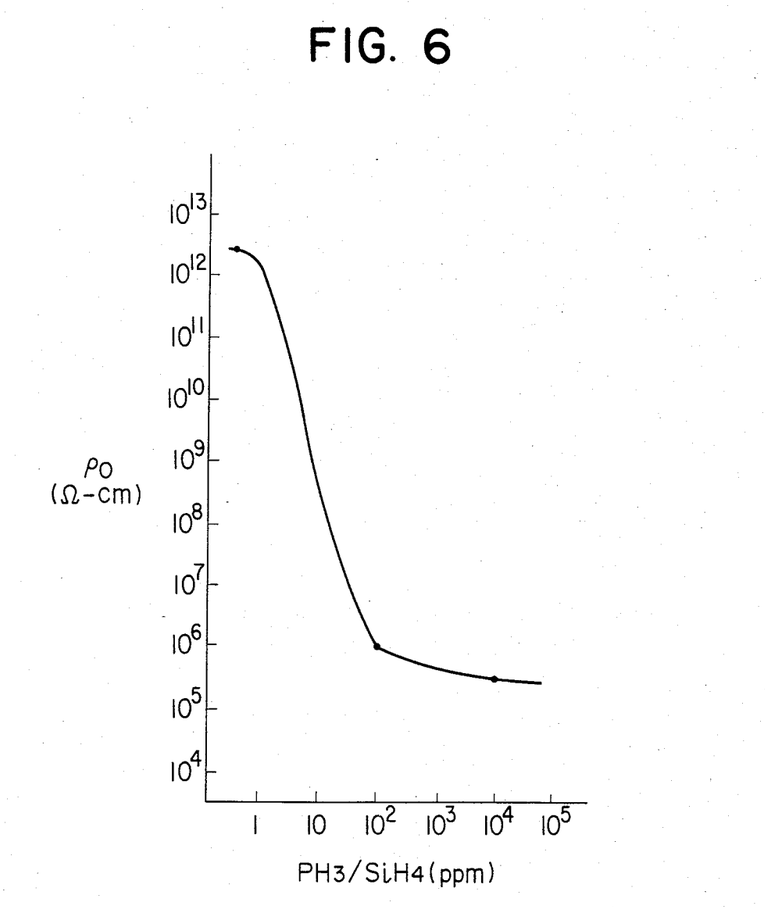
FIG. 6 is a graph of the dark resistance of doped a-SiC:H versus the flow rate ratio $PH_3/SiH_4$ used for coating.

FIG. 6 is a logarithmic plot of the dark resistance $\rho_D$ of the a-SiC:H layer 5 versus the flow rate ratio of phosphine $PH_3$ and monosilane $SiH_4$ as used in precipitation of such layer. Phosphorus doping with $PH_3$ lowers $\rho_D$, which shows that a-SiC:H that is originally of n type is converted to the n+ type by a higher content of impurities resulting from such phosphorus doping. It was found that this provides a blocking layer that can satisfactorily prevent injection of carriers from the above mentioned substrate. To perform heavy doping to achieve a higher phosphorus doping level that results in conversion to the n+ type, the flow rate ratio of $PH_3/SiH_4$ is preferably set to 100 to 10,000 ppm.

Figure 7:
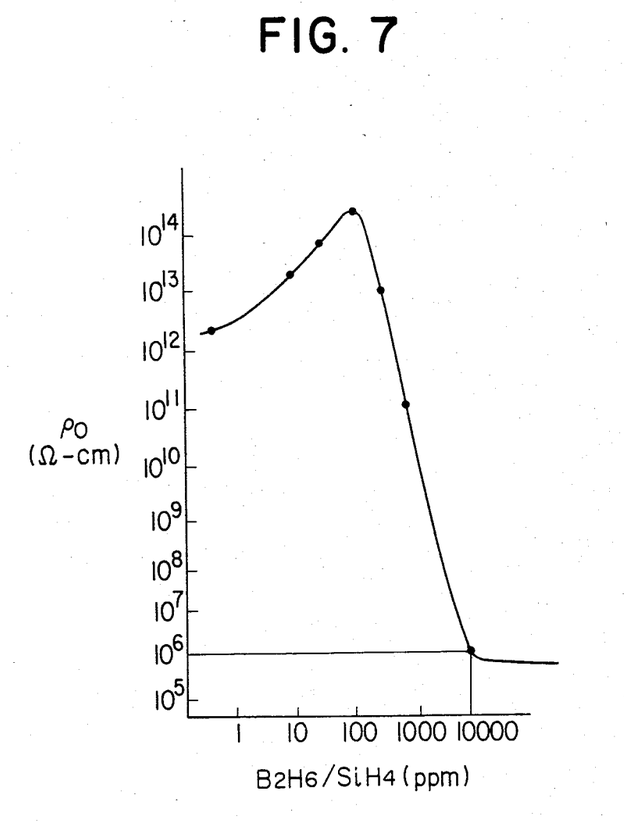
FIG. 7 is a graph of the dark resistance of doped a-SiC:H versus the flow rate ratio of $B_2H_6/SiH_4$ used for coating.

FIG. 7 is a logarithmic plot of the dark resistance $\rho_D$ of the a-SiC:H layer 5 versus the flow rate ratio of diborane and monosilane in case such layer is doped with an impurity of group IIIA. Generally, the undoped a-SiC:H exhibits a slight n type behavior in conductivity. When doped with boron, however, it becomes practically intrinsic in nature. As the boron doping level is further increased with the flow rate ratio of $B_2H_6/SiH_4$ raised above 100 ppm, it is then transformed into the p type. The results in FIG. 4 show that if the flow rate ratio of $B_2H_6/SiH_4$ is selected properly to achieve the object of the invention, a-SiC:H can be converted into the p type and even into the p+ type as necessary.

The doping level of phosphorus or boron of the a-SiC:H layer 5 must be selected properly, which, when expressed by the flow rate ratio of phosphine or diborone to silane ($PH_3/SiH_4$ or $B_2H_6/SiH_4$), is preferably 100 to 10,000 ppm or 100 to 100,000 respectively.

As mentioned above, the photoreceptor conforming to the present embodiment comprises the a-SiC:H layer 5 that is converted into the n type or p type by impurity doping, a-SiC:H layer 2 and a-Si:H layer 3, so the combination of these layers cooperatively improves the surface potential retention, dark resistance, and further charging characteristics of the photoreceptor. It is noted that this a-SiC:H layer 5 can be the same as the a-SiC:H layer 2 with respect to the carbon and hydrogen content and also the fluorine content in case of fluorination of such layer.

Figure 8:
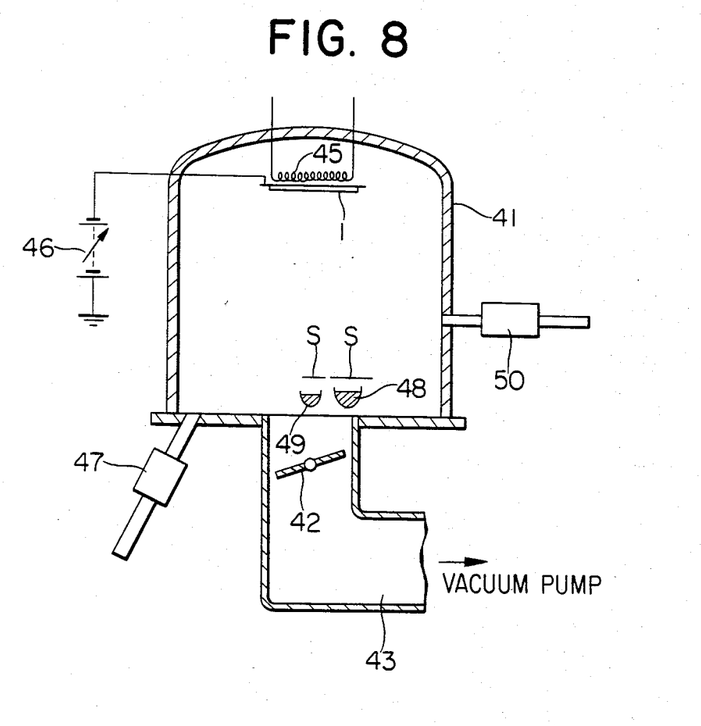
FIG. 8 is a schematic sectional view of evaporation apparatus.

FIG. 8 is an evaporation apparatus that is used to fabricate the photoreceptor embodying the present invention by the evaporation process.

The bell jar 41 is connected to a vacuum pump (not shown) through an evacuation pipe 43 fitted with a butterfly valve 42. The inside of this bell jar 41 is thereby set to a high vacuum of $10^{-3}$ to $10^{-7}$ Torr. A substrate 1 that is disposed in the bell jar 41 is heated by a heater 45° to 150° to 500° C. and preferably to 250° to 450° C. while a d.c. voltage of 0 to $-10$ kV and preferably $-1$ to $-6$ kV is applied from the d.c. power supply 46 to that substrate 1. A hydrogen gas discharge tube 47 opens into the vaccum chamber at a point opposite the substrate 1, from which activated hydrogen and hydrogen ions are introduced into the bell jar 41. At the same time, a silicon vapor source 48 and aluminium or antimony vapor source 49 that are disposed opposite to the substrate 1 are heated with each top shutter S open to simultaneously vaporize silicon and aluminium or antimony at an vaporization rate ratio, for example, of 1:0.01. Further, methane gas that is activated in a discharge tube 50 is introduced. A n+ type or p type a-SiC:H layer 5 (see FIG. 5) containing the prescribed content of aluminium or antimony is thus formed on the substrate 1. The a-SiC:H layers 2 and 4 can be deposited by stopping the vaporization of aluminium while the a-Si:H layer 3 can be deposited by stopping the supply of aluminium or antimony and methane gas.

Figure 9:
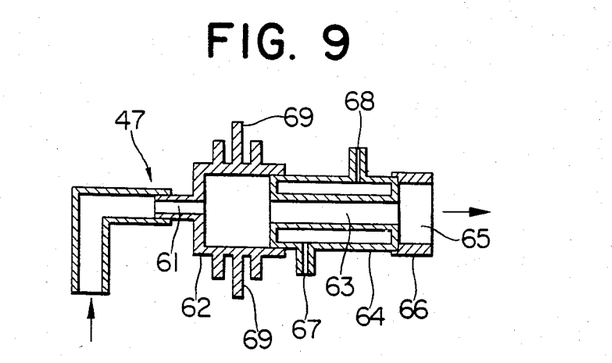
FIG. 9 is a sectional view of the discharging portion of the apparatus of FIG. 8.

The construction of the above discharge tubes 47 and 50 can be understood, for example, with reference to the former as illustrated in FIG. 9. It comprises an electrode member 62 of cylindrical form provided with a gas inlet 61, a discharge cavity 63 with such electrode member 62 disposed on one end, a discharge cavity member 64 enclosing such discharge cavity 63 as, for example, a glass cylinder, and the other electrode member 66 of ring form disposed on the other end of such discharge cavity 63 and having an outlet 65. Application of a d.c. or a.c. voltage between the above two electrode members 62 and 66 starts glow discharges in the discharge cavity 63 filled with a gas, for example, hydrogen gas supplied from the gas inlet 61. Active hydrogen comprising hydrogen atoms or molecules activated by electron energy and also hydrogen ions resulting from ionization are vented through the outlet 65. The discharge cavity member 64 illustrated in FIG. 9 has a double tube construction to allow the flow of cooling water which comes in from the cooling water inlet 67 and goes out from the cooling water outlet 68. The electrode member 62 is equipped with cooling fins 69. In the above hydrogen gas discharge tube, the electrode distance is 10 to 15 cm, the applied voltage is 600 V and the gas pressure in the discharge cavity 63 is set to about $10^{-2}$ Torr.

Also in the photoreceptor fabricated by the evaporation apparatus of FIGS. 8 and 9, the a-SiC:H layer 5 is converted to the p type or n type by doping with aluminium or antimony. For this purpose, on evaporation, aluminium or antimony is preferably evaporated to a concentration of 100 to 10,000 ppm or 100 to 10,000 ppm respectively, in silicon vapors.

Actual examples of the electrophotographic photoreceptor of FIG. 5 will be described below.

EXAMPLES 5 through 8

An electrophotographic photoreceptor constructed as in FIG. 5 was fabricated on an aluminium substrate by the glow discharge process as follows. First, a clean aluminium substrate with smooth surfaces was installed in the vacuum reaction chamber of glow discharger. The reaction chamber was then evacuated to a high vacuum of $10^{-6}$ Torr in order of magnitude. After the substrate was heated to 200° C., argon gas of high purity was introduced and under a back pressure of 0.5 Torr a high frequency voltage of 13.56 MHz was applied at a power density of 0.04 W/cm² for preliminary 15 min discharges. Next, a reactant gas comprising SiH$_4$ and CH$_4$ was introduced. As a gas mixture Ar+SiH$_4$+CH$_4$ supplied at a flow rate ratio of 2:1:0.8 and PH$_3$ or B$_2$H$_6$ gas were decomposed by glow discharges to precipitate an a-SiC:H layer intended to prevent carrier injection while decomposition of the same gas mixture Ar+SiH$_4$+CH$_4$ without supply of PH$_3$ or B$_2$H$_6$ gas resulted in an a-SiC:H layer intended for charge retention and charge transport. The precipitation rate was 2 μm/hr. After the reaction chamber was evacuated again, SiH$_4$ was introduced with carrier gas argon without supply of CH$_4$ for decomposition under discharges to precipitate the sensitive a-Si:H layer. The surface modifying layer (a-SiC:H) was then precipitated to complete an electrophotographic photoreceptor.

With the electrophotographic photoreceptor thus fabricated, there were conducted corona discharges with application of a voltage of 6 kV in both polarities to charge its surface negative or positive. After 6 sec of dark decay, it was exposed to 1 lux of light, when the surface potential declined almost linearly. At this time, the half decay exposure was low and there was detected almost no residual potential. Repeated charging and exposure showed very favorable repetition characteristics.

COMPARATIVE EXAMPLES 2 and 3

Except for the omission of PH$_3$ or B$_2$H$_6$ gas from the reaction gas mixture, the same method as in Examples 5 through 8 was used to fabricate the a-SiC:H layer 5 on an aluminium substrate. The resultant photoreceptors were tested as in Examples 5 through 8, which showed a low charging potential and fast dark decay and further gave copies of low maximum copy density.

The above photoreceptors embodying the invention and photoreceptors fabricated for comparison (they were all made by the glow discharge process) were subjected to a performance test on a modified copier of model U-Bix V-2 (supplier: Konishiroku Photo Industry Co., Ltd.) with use of an electrometer (manufacturer: Kawaguchi Denki Co., Ltd.). The results are summarized in the following table:

|  | Example | | | | Comparative Example | |
| --- | --- | --- | --- | --- | --- | --- |
|  | No. 5 | No. 6 | No. 7 | No. 8 | No. 2 | No. 3 |
| Charging | Positive | Positive | Negative | Negative | Positive | Negative |
| Blocking layer: | | | | | | |
| Impurity doping level | B$_2$H$_6$ 200 ppm | B$_2$H$_6$ 10000 ppm | PH$_3$ 200 ppm | PH$_3$ 1000 ppm | — | — |
| Base material | a-SiC:H | a-SiC:H | a-SiC:H | a-SiC:H | — | — |
| Conductivity type | p | p+ | n+ | n+ | — | — |
| $\rho_D$ (ohm-cm) | $9.2 \times 10^{13}$ | $2.2 \times 10^9$ | $1.7 \times 10^7$ | $3.5 \times 10^6$ | $2.6 \times 10^{12}$ | $2.6 \times 10^{12}$ |
| Electrostatic characteristics: | | | | | | |
| V | +420 | +440 | −410 | −430 | +380 | −350 |
| $\Delta V/V$ | 22% | 20% | 21% | 20% | 35% | 40% |
| $E_{\frac{1}{2}}$ | 0.8 | 0.9 | 0.8 | 0.8 | 0.92 | 0.90 |
| $V_R$ | 40 | 37 | 38 | 37 | 37 | 38 |

It is noted that in these test samples, the surface modifying layer was a 1500 Å thick a-SiC:H layer, the photoconductive layer was a 1 μm thick a-Si:H layer, the potential retention layer was a 15 μm thick a-SiC:H layer containing 10 atomic percent of carbon atoms, the substrate was an aluminium plate, and the blocking layer was 2,000 Å thick.

In the above table, the parameter V of the electrostatic characteristics was the initial charging potential, $\Delta V/V$ was the percentage dark decay of potential 6 sec after completion of charging, $E_{\frac{1}{2}}$ was the half decay exposure (unit: lux.sec), and $V_R$ was the residual potential.

It was concluded from the above results that the photoreceptors embodying the present invention were characterized by a satisfactorily high charging potential, low percentage dark decay, and yet high sensitivity. Further, it was also found that when a number of copies were continuously made with them, sharp images of high copy density were available. By contrast, the photoreceptor of the Comparative Examples gave inferior results in the charging potential level, dark decay, etc. performing very poorly in the repetition characteristics.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A photoreceptor comprising a photoconductive layer having a thickness of at least 2500 Å, said photoconductive layer being composed of at least one compound selected from the group consisting of hydrogenated amorphous silicon and fluorinated amorphous silicon, a surface modifying layer formed on an upper surface of said photoconductive layer and composed of at least one compound selected from the group consisting of hydrogenated amorphous silicon carbide and fluorinated amorphous silicon carbide wherein the thickness "t" of said surface modifying layer is in the range 400 Å $\leq t < 2,000$ Å, a charge transport layer formed on a lower surface of said photoconductive layer and composed of at least one compound selected from the group consisting of hydrogenated amorphous silicon carbide and fluorinated amorphous silicon carbide, and an electrically conductive substrate.

2. The photoreceptor as claimed in claim 1 wherein the thickness of said photoconductive layer is 2,500 Å to 5 μm and the thickness of the charge transport layer is 5,000 Å to 80 μm.

3. The photoreceptor as claimed in claim 1 wherein said charge transport layer has a carbon content of 10 to 90 atomic percent and a hydrogen content of 10 to 30 atomic percent.

4. The photoreceptor as claimed in claim 3 wherein said charge transport layer contains fluorine in an amount of 0.5 to 10 atomic percent.

5. The photoreceptor as claimed in claim 1 wherein said photoconductive layer has a hydrogen content of 10 to 30 atomic percent.

6. The photoreceptor as claimed in claim 5 wherein said photoconductive layer contains fluorine in an amount of 0.5 to 10 atomic percent.

7. The photoreceptor as claimed in claim 3 wherein said surface modifying layer has a carbon content of 10 to 90 atomic percent and a hydrogen content of 10 to 30 atomic percent.

8. The photoreceptor as claimed in claim 7 wherein said surface modifying layer contains fluorine in an amount of 0.5 and 10 atomic percent.

9. The photoreceptor as claimed in claim 1, further comprising a blocking layer formed between said charge transport layer and said substrate and composed of said amorphous silicon carbide and doped with impurities capable of converting said blocking layer into a prescribed conductivity type.

10. The photoreceptor as claimed in claim 9 wherein said blocking layer is doped with at least one element selected from Group VA of the Periodic Table to thereby exhibit n type or n+ type conductivity.

11. The photoreceptor as claimed in claim 9 wherein said blocking layer is doped with at least one element selected from Group IIIA of the Periodic Table to thereby exhibit p type conductivity.

12. The photoreceptor as claimed in claim 10 wherein the blocking layer is formed by decomposing under a glow discharge a first reactant gas containing silicon atoms and at least one member selected from hydrogen atoms and fluorine atoms and a second reactant gas containing at least one element selected from Group VA of the Periodic Table, said second reactant gas being fed at a concentration of between 100 and 10,000 ppm releaive to said first reactant gas to thereby precipitate an n or n+ type amorphous silicon carbide.

13. The photoreceptor as claimed in claim 11 wherein the blocking layer is formed by decomposing under a glow discharge a first reactant gas containing silicon atoms and at least one member selected from hydrogen atoms and fluorine atoms and a second reactant gas containing at least one element selected from Group IIIA of the Periodic Table, said second reactant gas being fed at a concentration between 1,000 and 100,000 ppm relative to said first reactant gas to thereby precipitate a p type amorphous silicon carbide.

14. The photoreceptor as claimed in claim 10 wherein the blocking layer is formed by vaporization of a first reactant gas containing silicon and a second reactant gas containing at least one element selected from Group VA of the Periodic Table in the presence of at least one member selected from hydrogen atoms and fluorine atoms, said second reactant gas being fed at a concentration of between 100 and 10,000 ppm relative to said first reactant gas to thereby precipitate an n type or n+ type amorphous silicon carbide.

15. The photoreceptor as claimed in claim 11 wherein the blocking layer is formed by vaporization of a first reactant gas containing silicon and a second reactant gas containing at least one element selected from Group VA of the Periodic Table in the presence of at least one member selected from hydrogen atoms and fluorine atoms, said second reactant gas being fed at a concentration of between 100 and 10,000 ppm relative to said first reactant gas to thereby precipitate an n type or n+ type amorphous silicon carbide.

16. The photoreceptor as claimed in claim 9 wherein the thickness of sdid blocking layer is between 400 Å and 1 μm.

17. The photoreceptor as claimed in claim 9 wherein the carbon content of said blocking layer is between 10 and 90 atomic percent.

18. A photoreceptor comprising:
(a) a photoconductive layer composed of at least one compound selected from the group consisting of hydrogenated amorphous silicon and fluorinated amorphous silicon having a hydrogen content of 10 to 30 atomic percent, said photoconductive layer having a thickness of 2,500 Å to 5 μm;
(b) a surface modifying layer formed on an upper surface of said photoconductive layer and composed of at least one compound selected from the group consisting of hydrogenated amorphous silicon carbide and fluorinated amorphous silicon carbide and having a carbon content of 10 to 90 atomic percent and a hydrogen content of 10 to 30 atomic percent, said surface modifying layer having a thickness "t" in the range of $400 \text{ Å} \leq t < 2,000$ Å;
(c) a charge transport layer formed on a lower surface of said photoconductive layer and composed of said amorphous silicon carbide and having a carbon content of 10 to 90 atomic percent and a hydrogen content of 10 to 30 atomic percent, said charge transport layer having a thickness of 5,000 Å to 80 μm; and
(d) an electrically conductive substrate.

19. The photoreceptor as claimed in claim 17 wherein at least one of said layers contains fluorine in an amount of 0.5 to 10 atomic percent.

20. The photoreceptor as claimed in claim 18 or 19 further comprising a blocking layer formed between said charge transport layer and said substrate and doped with at least one element selected from Group VA of the Periodic Table to thereby exhibit n type or n+ type conductivity.

21. The photoreceptor as claimed in claim 18 or 19 further comprising a blocking layer formed between said charge transport layer and said substrate and doped with at least one element selected from Group IIIA of the Periodic Table to thereby exhibit p type conductivity.

22. The photoreceptor as claimed in claim 1 wherein the thickness of the photoconductive layer is 2500 Å to 5 μm.

* * * * *

UNITED STATES PATENT AND TRADEMARK OFFICE
CERTIFICATE OF CORRECTION

PATENT NO. : 4,510,224
DATED : April 9, 1985
INVENTOR(S) : Toshinori YAMAZAKI, et al It is certified that error appears in the above-identified patent and that said Letters Patent is hereby corrected as shown below:

Column 13, line 27, after "vacuum of" change the numeral designation from "$10^{316}$" to --$10^{-6}$--.

Column 15, line 49 (claim 12), after "ppm" change "releaive" to --relative--.

Signed and Sealed this

Twenty-first Day of January 1986

[SEAL]

Attest:

DONALD J. QUIGG

Attesting Officer

Commissioner of Patents and Trademarks